United States Patent [19]

Verma

[11] 4,209,215
[45] Jun. 24, 1980

[54] MASS TERMINABLE SHIELDED FLAT FLEXIBLE CABLE AND METHOD OF MAKING SUCH CABLES

[75] Inventor: Surendra Verma, Irvine, Calif.

[73] Assignee: Hughes Aircraft Company, Culver City, Calif.

[21] Appl. No.: 963,599

[22] Filed: Nov. 24, 1978

[51] Int. Cl.² .................. H01R 3/04; H01R 13/38
[52] U.S. Cl. ........................... 339/17 F; 174/35 R; 339/99 R; 339/143 R
[58] Field of Search ............... 339/17 F, 99 R, 97 R, 339/97 P, 143 R, 143 C; 174/35 R, 35 C

[56] References Cited

U.S. PATENT DOCUMENTS

| 3,155,809 | 11/1964 | Griswold | 339/17 F |
| 3,691,509 | 9/1972 | Krol | 339/17 F |
| 3,697,925 | 10/1972 | Henschen | 339/17 F |
| 3,728,661 | 4/1973 | Kassabgi | 339/17 F |
| 3,768,067 | 10/1973 | Rault | 339/17 F |

*Primary Examiner*—Joseph H. McGlynn
*Attorney, Agent, or Firm*—Lewis B. Sternfels; W. H. MacAllister

[57] ABSTRACT

A shielded cable comprises a flat electrical insulator having a plurality of parallel spaced-apart conductors. A plurality of openings extend through the insulator to expose at least one conductor. The shield, which is formed from an electrically conductive coating, not only covers the exterior of the insulator but also enters the openings and is electrically connected to the conductor. Gaps are created in the electrically conductive coating so as to provide areas for interconnection by an insulation displacement connector which "mass-terminates" all of the connectors. The exposed one conductor, which is in contact through the openings with the electrically conductive coating, maintains the electrical continuity of the shield notwithstanding the gap formed therein.

4 Claims, 9 Drawing Figures

Fig. 1.
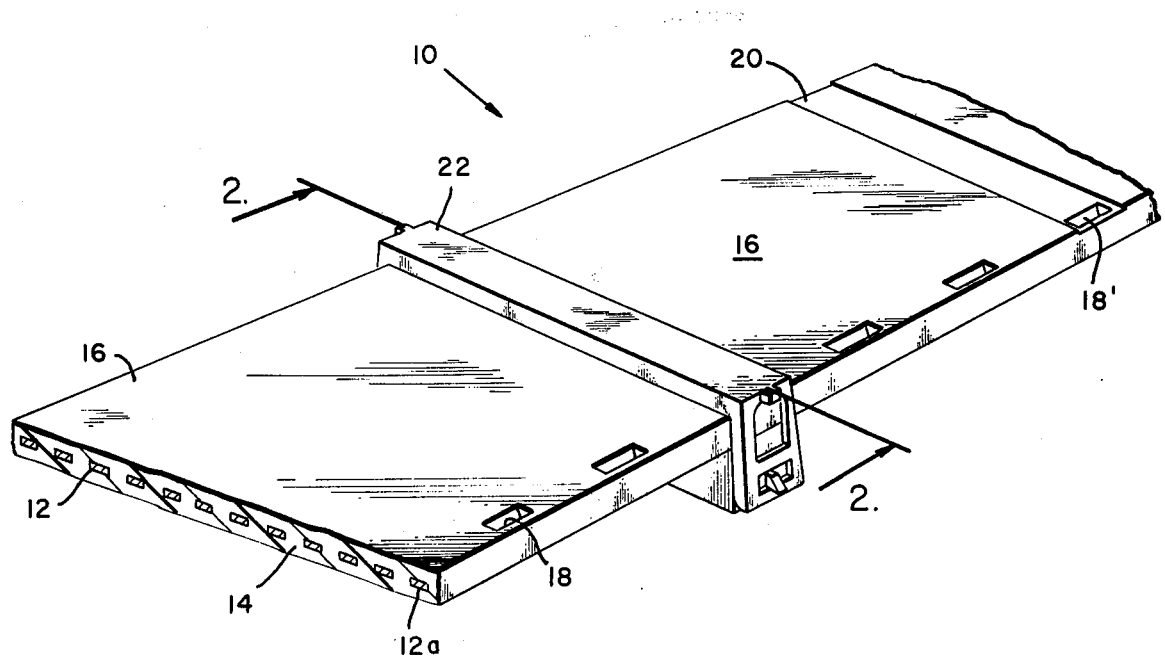
Fig. 2.
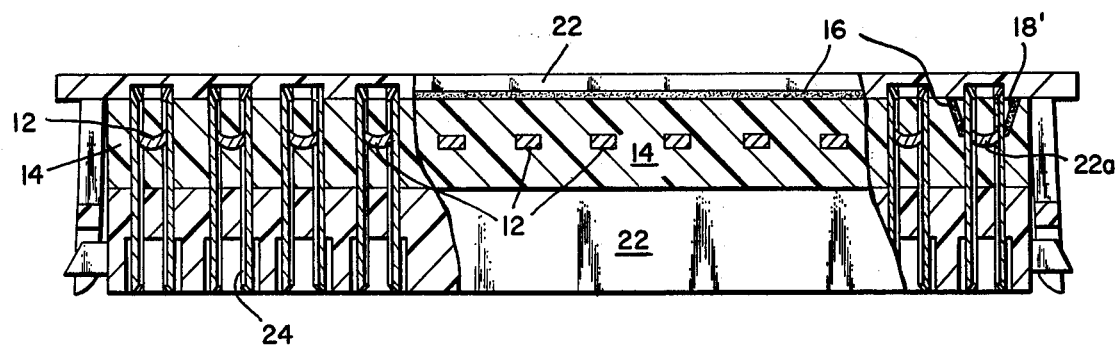
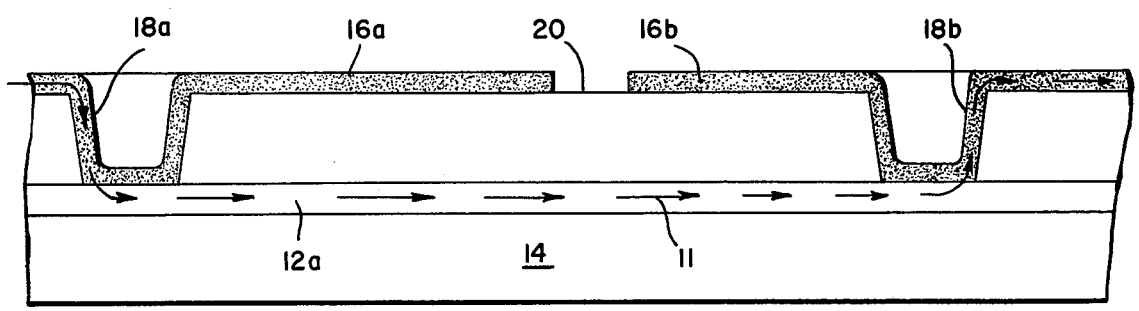
Fig. 7.

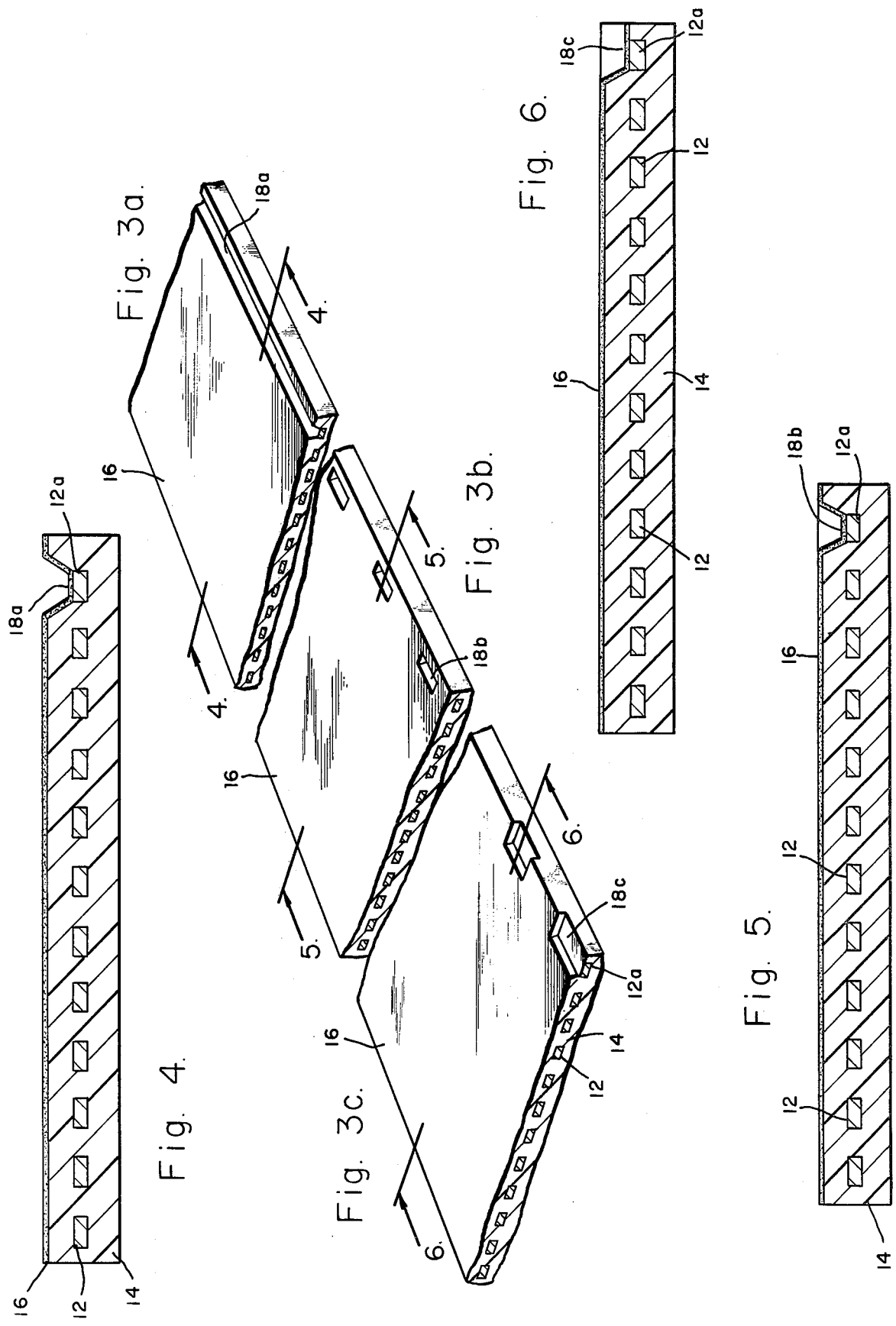

MASS TERMINABLE SHIELDED FLAT FLEXIBLE CABLE AND METHOD OF MAKING SUCH CABLES

BACKGROUND OF THE INVENTION

1. Field of the Invention

This invention relates, in general, to improvements in shielded multiconductor, flat circuitry and, more particularly, to means for and methods of terminating, especially mass terminating, the circuitry while maintaining electrical continuity in the shielding.

2. Description of the Prior Art

Multiconductor, flat, flexible cables, hereinafter also referred to as flat cables, have come into extensive use. They generally include a ribbon of tape of an insulating material enclosing a plurality of round or thin flat conductors disposed in parallel spaced-apart relationship. In some applications, flat cables must be electrically shielded to prevent cross talk. Such electrical shielding may be encapsulated with the insulation of the cable, as in U.S. Pat. Nos. 3,576,723 and 3,612,743, or deposited on an exterior surface of the insulation, as in U.S. Pat. No. 3,469,016.

Such cables, with or without shielding, have been terminated by various means, such as the insulation displacement connector exemplified by U.S. Pat. No. 3,444,506. Such termination presents no problems when the cable is unshielded.

In some applications, however, it is desirable to mass terminate the shielded cable. In these applications, the presence of the shield impedes mass termination, since the connectors cannot be terminated directly to the cable because the shield would short-circuit the conductors. Therefore, the shield has to be separate from the conductors, and the conductors and shield have to be terminated separately. Various methods have been used in the past to accomplish this; one method was to first to cut away the shield from that portion of the cable where the conductors were to be terminated, to prevent short circuiting of the shield to the conductors. However, this method was undesirable because the electrical shield was no longer electrically terminated to the connector and there were electrical discontinuities in the shield. Another method, as noted in the above-mentioned patents, was to place a drain wire in continuous contact with the shield along the length of the cable. This overcame the problem of terminating the shield to the connector. However, the obstacle of having to remove the shield still remained. Several other difficulties arose therefrom, including having to jacket the cables and to precisely space the drain conductor from the core cable conductors. Using this method, mass termination was still cumbersome, since the insulation jacket had to be stripped to reach the shield, and the shield had to be cut away to reach the drain wire. Also, during these operations, extra care had to be used in order to maintain the spacing of the drain wire from the conductors.

SUMMARY OF THE INVENTION

A shielded flat circuit, such as flexible cable, has a plurality of openings or an elongated opening in its insulation to expose at least one conductor so that an electrical shield, comprising an electrically conductive coating material on the exterior of the flat cable, repeatedly contacts the conductor. In order to mass terminate the cable, a portion of the electrically conductive coating material is removed where the termination, such as by an insulation displacement connector, is to take place. The connector is placed in contact with the cable and thereby terminates each conductor as well as the shield, since the one conductor is electrically coupled to the shield through each of the repeated contacts. These contacts also insure that the separated portions of the electrical shield remain in electrical continuity with each other.

It is, therefore, an object of this invention to provide improved means for and methods of mass terminating shielded multiconductor flat circuitry.

Another object of this invention is to ensure electrical continuity in the shield, even when portions thereof are removed for purposes of electrical termination, without affecting the electrical shielding capabilities of the shield.

A further object of this invention is to terminate the shield as well as the signal conductors.

Yet another object of this invention is to provide improved means for, and methods of, making mass terminable shielded flat circuitry resulting in ease of manufacture, good electrical characteristics, and high reliability.

Other objects, features, and advantages of this invention will become apparent upon reading the following detailed description, and referring to the accompanying drawings, wherein like characters refer to like parts.

BRIEF DESCRIPTION OF THE DRAWINGS

FIG. 1 is a perspective view of a flat shielded multiconductor cable terminated by a conductor affixed thereto, and showing an additional area for further interconnection;

FIG. 2 is a partial cross-sectional view of the cable and the connector across line 2—2 of FIG. 1, with a full side view of the connector shown in the center portion of FIG. 2;

FIGS. 3a–3c are perspective views of three sections of a flat shielded multiconductor cable, wherein each section shows various ways in which a conductor may be exposed for contact with a shield;

FIG. 4 is a cross-sectional view across line 4—4 of FIG. 3a;

FIG. 5 is a cross-sectional view across line 5—5 of FIG. 3b;

FIG. 6 is a cross-sectional view across line 6—6 of FIG. 3c; and

FIG. 7 is a diagrammatic illustration of the flow of charge through a coupling drain wire between discontinuous portions of the shield.

DESCRIPTION OF THE PREFERRED EMBODIMENTS

Referring first to FIG. 1, a shielded cable 10 is shown. Enclosed within a flat electrical insulating material (hereinafter "insulation") 14 are a plurality of parallel spaced-apart conductors 12, which may be either laminated or encapsulated in the insulation. A plurality of openings 18 extend through the insulation 14 to expose at least one conductor 12a, which may be used as a grounding or drain wire. For single shielded cables, the conductor is exposed on one side, for double shielded cables, on two sides. A shield 16, formed from an electrically conductive coating, covers the exterior of the insulation 14, and enters openings 18 to contact the exposed conductor 12a. A gap 20 is located in the shield 16 where an electrical connector is to be placed to terminate cable 10. While shown intersecting one of the openings 18, specifically opening 18, so as to provide areas of the interconnection, the gap 20 may be located at any desired point along cable 10, on or between openings 18. An insulation displacement connector 22 for terminating the conductors 12, is shown installed over another gap 20. Even though the gaps 20 separate the shield into discontinuous sections, conductor 12a, which is in contact through all openings 18 with the shield 16, will maintain the electrical continuity of the adjoining physically discontinuous sections of the shield 16, as will be described in greater detail with respect to FIG. 7.

As shown in the cross-sectional ends of FIG. 2, connector 22 has electrically conductive spaced-apart prongs 24 connected to each one of the electrical conductors 12, so as to terminate each of them. As can be seen, the electrically conductive material has been removed under connector 22, including that opening 18 which resides under the gap 20. There, the electrical shield 16 is electrically terminated through hole 18 to conductor 12a which is also connected to one of the prongs 24.

Referring now to FIGS. 3aa–3c, shielded cables similar to that depicted in FIG. 1, respectively, exemplify three types of openings used for contacting the shield 16 through insulation 14 with the conductor 12a. In FIG. 6, openings 18c extend at intervals through the top and one edge of the insulation to expose conductor 12a. In FIG. 5 openings 18b extend periodically, at close intervals, through the insulation 14 to expose conductor 12a. Finally, the single, continuous opening 18a extends along the length of conductor 12a through the insulation as shown in FIG. 4. Regardless of whether a plurality of openings or a single continuous opening is used, all constitute a means for effecting repeated contact between shield 16 and drain wire 12a. The precise shape of the openings is discretionary, depending upon the particular method used to effect the openings.

The continuous opening 18a, shown in FIG. 4 over the length of conductor 12a in insulation 14, is created by stripping away material 14 in the area over conductor 12a.

In FIG. 5, openings 18b, comprising a plurality of holes, are made periodically at close intervals by prepunching insulation material 14 during fabrication.

In FIG. 6, openings 18c, formed as a plurality of holes, are made periodically along the edge of conductor 12a by modifying manufacturing tooling so as to expose conductor 12a during cable fabrication.

In FIG. 7, two separate portions 16a and 16b in shield 16 are created by a gap 20. The flow or drain of current, indicated by arrows 11, from portions 16a to 16b is continuous due to conductor 12a acting as a drain wire to electrically couple the portions through holes 18a and 18b. Therefore, regardless of the gaps 20 that are formed in shield 16, there will always be electrical continuity of the shield through the conductive holes atop conductor 12a.

The cable may be fabricated by enclosing a plurality of side-by-side spaced-apart conductors in insulation either by lamination or by encapsulation. Where at least one conductor is to be exposed by periodic openings over the conductor, the insulation is prepunched with the desired pattern of openings, and then placed so that the pattern is aligned over the conductor when the cable is fabricated. Alternatively, the conductor may be exposed by stripping the insulation material in the area of the conductor in a desired pattern. Regardless of the specific means by which openings 18 are formed, an electrically conductive shield is deposited over the cable by any suitable process, such as by vacuum deposition, spraying, printing, and plating, and is thereby concurrently placed in contact with the exposed conductor through the openings.

The cable then may be terminated by either soldering or by mass termination using a connector. When solder is used, the cable is stripped using a commercially available stripper. The stripping process removes unwanted insulation as well as the shield over desired locations. No further preparation of the cable is necessary. All conductors, including the exposed conductors, are in one plane and are stripped in a single operation. The cable is then soldered by hand or by reflow soldering.

When a conductor is utilized for termination, the cable shield, especially the vacuum-deposited shield, is erased across the width of the cable over a sufficient width for the connector. The erasing can be effected using such simple means as a common pencil eraser, electric eraser, etc. Some types of deposited shields may be erased by stripping or chemical cleaning. The connector is then installed over the location where the shield was removed. Even though erasing physically breaks the shield on the cable surface into separate segments, the exposed conductor, drain wire 12a, maintains the electrical continuity between adjoining sections of the shield.

A suitable type of connector used for mass termination is the commerically available "insulation-displacement-connector." This connector is of a two-piece construction, consisting of a base with insulation-displacement contacts and a cover. For use with flat-conductor cable, some manufacturers also make a special adaptor to be used with the cable and the connector, and the termination is accomplished with an appropriate installation tool.

This invention was tested on a cable designed with 34 conductors, flat 0.003"×0.025" center-to-center spacing, with polyester insulation. One of the conductors was exposed along one edge every 1.5 inches approximately over 3/10 inch by stripping. An aluminum shield was vacuum deposited over this side of the cable. Shield segments of ¼ inch width were erased with pencil eraser over several desired locations. Over these locations, the cable was terminated to Blue Mac (registered trademark of Ansley Corporation) connectors, such as illustrated in FIG. 2.

Although the invention has been described with reference to particular embodiments thereof, it should be realized that various changes and modifications may be made therein without departing from the spirit and scope of the invention.

What is claimed is:

1. Shielded, flat, multiconductor circuitry, comprising:
   a plurality of conductors;
   insulation enclosing said conductors;
   electrically conductive material disposed on the exterior of said insulation and having means for establishing repeated electrical contacts with at least one of said conductors; and
   at least one gap in said electrically conductive material defining at least one location for coupling said plurality of conductors to terminal means, said electrical contact establishing means in conjunction with said one conductor maintaining electrical continuity of said electrically conductive material across said gap.

2. The shielded, flat, multiconductor circuitry of claim 1 in which said electrical contact establishing means comprise a series of spaced openings in said insulation aligned with said at least one conductor for electrically coupling said electrically conductive material to said one conductor.

3. The shielded, flat, multiconductor circuitry of claim 1 in which said electrical contact establishing means comprise a continuous opening in said insulation for electrically coupling said electrically conductive material to said one conductor.

4. The shielded, flat, multiconductor circuitry of claim 1 wherein said terminal means comprises an insulation displacement connector.

* * * * *